United States Patent
Lee et al.

(10) Patent No.: US 12,352,810 B2
(45) Date of Patent: Jul. 8, 2025

(54) SYSTEM FOR TESTING PERFORMANCE OF DEVICE IN TEMPERATURE LOAD TEST

(71) Applicant: ATECO INC., Gunpo-si (KR)

(72) Inventors: Taek Seon Lee, Hwaseong-si (KR); Ho Nam Kim, Seongnam-si (KR); Sung Chul Moon, Gunpo-si (KR); Sang Bong Lee, Suwon-si (KR); Se I Mi Choi, Anyang-si (KR)

(73) Assignee: ATECO INC., Gunpo-si (KR)

( * ) Notice: Subject to any disclaimer, the term of this patent is extended or adjusted under 35 U.S.C. 154(b) by 154 days.

(21) Appl. No.: 18/341,860

(22) Filed: Jun. 27, 2023

(65) Prior Publication Data
US 2024/0248133 A1 Jul. 25, 2024

(30) Foreign Application Priority Data
Jan. 25, 2023 (KR) .................. 10-2023-0009679

(51) Int. Cl.
*G01R 31/28* (2006.01)
*G01R 1/04* (2006.01)

(52) U.S. Cl.
CPC ....... *G01R 31/2874* (2013.01); *G01R 1/0441* (2013.01)

(58) Field of Classification Search
CPC .............. G01R 1/0441; G01R 31/2874; G01R 31/2877; G01R 31/2891; G01R 31/2863; G01R 31/2875; G01R 19/0069; H01R 43/26; H01R 13/533; H01R 13/6683; H01R 33/945; H01R 4/48
See application file for complete search history.

(56) References Cited

U.S. PATENT DOCUMENTS

| | | | | |
|---|---|---|---|---|
| 7,870,800 B2* | 1/2011 | Di Stefano | ........ | G01R 31/2877 73/866.5 |
| 11,726,137 B2* | 8/2023 | Scocchetti | ......... | G01R 31/2863 324/750.08 |
| 2009/0183866 A1* | 7/2009 | Sakaue | .............. | G05D 23/1904 165/287 |
| 2015/0122469 A1* | 5/2015 | Jensen | ............... | G01R 31/2874 165/168 |
| 2023/0251304 A1* | 8/2023 | Yamada | ............... | G01R 1/0466 324/750.03 |

FOREIGN PATENT DOCUMENTS

| KR | 10-2010-0078365 A | 7/2010 |
|---|---|---|
| KR | 10-2014-0127389 A | 11/2014 |
| KR | 10-2015-0123377 A | 11/2015 |

* cited by examiner

*Primary Examiner* — Vinh P Nguyen

(57) ABSTRACT

A system for testing the performance of a device includes: a tester including a plurality of sockets capable of making electrical contact with a plurality of devices inserted therein, that tests the performance of the devices; a pusher including a plurality of push bodies for pushing the devices in a direction of the sockets, by which the plurality of devices are inserted into the plurality of sockets; a first temperature regulator which maintains the temperature of a first region within a predetermined temperature range during the test on the plurality of devices, the first region being a space between some of the plurality of sockets and the pusher; and a second temperature regulator which maintains the temperature of a second region within a predetermined temperature range during the test on the plurality of devices, the second region being a space between some other sockets and the pusher.

12 Claims, 9 Drawing Sheets

(a)

(b)

(c)

SYSTEM FOR TESTING PERFORMANCE OF DEVICE IN TEMPERATURE LOAD TEST

CROSS-REFERENCE TO RELATED APPLICATIONS

This application claims the benefit of Korean Patent Application No. 10-2023-0009679, filed on Jan. 25, 2023, the contents of which are all hereby incorporated by reference herein in their entirety.

BACKGROUND

Field

The present disclosure relates to a system for testing the performance of a device and, more particularly, to a system for testing the performance of a device, that is capable of actively coping with temperature changes when performing a temperature load test.

Related Art

A device performance tester is a device used to inspect various kinds of devices (for example, a variety of electronic parts such as semiconductor devices, modules, or SSDs) after manufacturing. Such a device performance tester inspects whether a connected device operates normally by artificially creating various environments for the device.

After the inspection, the device may be classified by a handler operating in conjunction with it as good, needing a re-inspection, defective, etc. according to a test result. Here, the handler may be an apparatus that mounts multiple packaged devices on the device performance tester and/or removes a tested device from the device performance tester and classifies it according to the result.

The tester is able to continuously perform an inspection in such a way that a tray where a device to be tested is loaded and a tray where a tested device is loaded are exchanged through the handler.

Meanwhile, an example of device performance test includes a temperature load test. The temperature load test is a test conducted to inspect whether a device meets a performance requirement under a particular temperature condition (high temperature or low temperature).

In some cases, however, the test environment could not maintain a temperature desired by the user during a temperature load test, due to heat generated from the tester. Also, a temperature distribution to different points on the tester may not be uniform, due to heat generated from the tester or a structural impact from the tester.

Thus, when a set temperature is not maintained or the test environment temperature varies from device to device, this results in a failure to properly perform a temperature load test or lowers the reliability of test results.

In particular, computing devices are often located adjacent to devices for the sake of fast processing as electronic parts of today have higher density so as to deliver high performance. Thus, heat generated from a computing device is bound to have a serious impact on the temperature load test environment, and makes it even more difficult to maintain the test environment at a constant temperature. Moreover, the above-mentioned temperature distribution non-uniformity problem has become more serious because each device's distance to the computing device varies.

SUMMARY

An aspect of the present disclosure is to provide a system for testing the performance of a device, that is capable of providing a uniform temperature environment for each device in a process of performing a temperature load test.

The aspects of the present disclosure are not limited to the foregoing, and other aspects not mentioned herein will be able to be clearly understood by those skilled in the art from the following description.

An embodiment of the present disclosure provides a system for testing the performance of a device, the system including: a tester including a plurality of sockets capable of making electrical contact with a plurality of devices inserted therein, that tests the performance of the devices; a pusher including a plurality of push bodies for pushing the devices in a direction of the sockets, by which the plurality of devices are inserted into the plurality of sockets; a first temperature regulator which maintains the temperature of a first region within a predetermined temperature range during the test on the plurality of devices, the first region being a space between some of the plurality of sockets and the pusher; and a second temperature regulator which maintains the temperature of a second region within a predetermined temperature range during the test on the plurality of devices, the second region being a space between some other sockets and the pusher.

The first temperature regulator may include: a first supply flow path formed inside the pusher, that receives a main temperature regulating fluid from the outside; a first fluid diffusion chamber formed inside the pusher so as to communicate fluid with the first supply flow path, in which the main temperature regulating fluid conveyed from the first supply flow path is diffused; and a plurality of first jet flow paths formed respectively in the push bodies, that communicate fluid with the first fluid diffusion chamber and convey the main temperature regulating fluid diffused in the first fluid diffusion chamber to the first region.

The second temperature regulator may include: a second supply flow path formed inside the pusher, that receives a main temperature regulating fluid from the outside; a second fluid diffusion chamber formed inside the pusher so as to communicate fluid with the second supply flow path, in which the main temperature regulating fluid conveyed from the second supply flow path is diffused; and a plurality of second jet flow paths formed respectively in the push bodies, that communicate fluid with the second fluid diffusion chamber and convey the main temperature regulating fluid diffused in the second fluid diffusion chamber to the second region.

The system may further include a fluid supply part connected to the first supply flow path and the second supply flow path in such a way as to communicate fluid, for supplying the main temperature regulating fluid to the first temperature regulator and the second temperature regulator at the same time, in order to regulate the temperatures of the first region and the second region are regulated at the same time.

The first temperature regulator may further include a first auxiliary flow path formed inside the pusher, that conveys an auxiliary temperature regulating fluid to the fist fluid diffusion chamber.

The first temperature regulator may further include a first temperature sensor for measuring the temperature of the first region.

The first temperature regulator may continuously supply the main temperature regulating fluid to the first region and selectively supply the auxiliary temperature regulating fluid to the first auxiliary flow path based on a temperature measured by the first temperature sensor, so that the temperature of the first region is maintained within a predetermined temperature range.

The first temperature regulator may further include a projecting member disposed inside the first fluid diffusion chamber to face an outlet of the first auxiliary flow path, that protrudes into an inner space of the first fluid diffusion chamber and disperses the auxiliary temperature regulating fluid conveyed from the first auxiliary flow path in the inner space of the first fluid diffusion chamber.

The first temperature regulator may further include a backflow preventing member positioned between an outlet of the first supply flow path and the projecting member, for blocking off part of the inner space of the first fluid diffusion chamber, so as to prevent the auxiliary temperature regulating fluid dispersed by the projecting member from flowing back from the inside of the first fluid diffusion chamber toward the outlet of the first supply flow path.

The backflow preventing member may divide the first fluid diffusion chamber into a first upper fluid diffusion chamber in which the outlet of the first supply flow path and the outlet of the first auxiliary flow path are positioned and a first lower fluid diffusion chamber in which an outlet of the first fluid diffusion chamber and the projecting member are positioned.

The backflow preventing member may include a fluid communicating hole through which fluid is communicated between the first upper fluid diffusion chamber and the first lower fluid diffusion chamber, so that the main temperature regulating fluid is conveyed to the first lower fluid diffusion chamber after being diffused in the first upper fluid diffusion chamber.

The backflow preventing member may include a center hole formed between the first auxiliary flow path and the projecting member so that the auxiliary temperature regulating fluid conveyed to the first upper fluid diffusion chamber is conveyed toward the projecting member.

Other detailed matters of the present disclosure are included in the detailed description and the drawings.

The embodiments of the present disclosure have at least the following advantageous effects.

The reliability of results of a temperature load test can be increased.

It is possible to maintain temperature uniformity in test regions during a test, by actively compensating for temperature differences between multiple devices in a testing process.

The effects according to the present disclosure are not limited to what has been exemplified above, and more various effects are included in the present specification.

DESCRIPTION OF EXEMPLARY EMBODIMENTS

Figure 1:
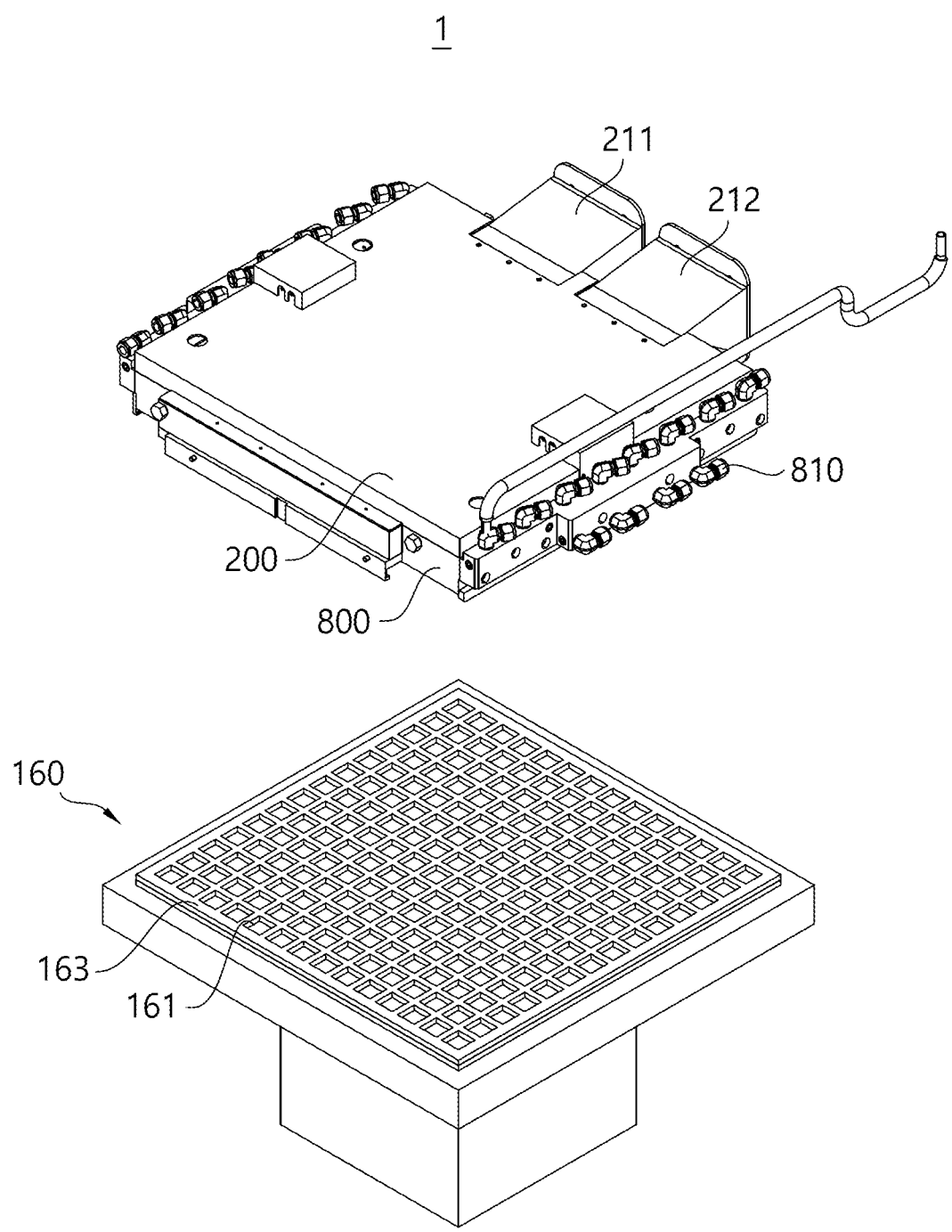
FIG. 1 is a view illustrating a system for testing the performance of a device according to an embodiment of the present disclosure.

Advantages and features of the present disclosure and methods for achieving them will be made clear from the embodiments described below in detail with reference to the accompanying drawings. The present disclosure may however, be embodied in many different forms, and should not be construed as being limited to the embodiments set forth herein. Rather, these embodiments are provided so that this disclosure will be thorough and complete, and will fully convey the scope of the present disclosure to those skilled in the art. The present disclosure is merely defined by the scope of the claims.

The embodiments to be described herein will be described with reference to cross-sectional views and/or schematic diagrams, which are ideal exemplary views of the present disclosure. Therefore, the forms of the exemplary views may be changed due to manufacturing techniques and/or allowable errors. For the convenience of description, constituent elements in the drawings of exemplary embodiments may be slightly enlarged or reduced. Like reference numerals refer to like elements throughout the specification.

The phrase "to communicate fluid" as mentioned below may mean that fluid can be moved or exchanged. More specifically, when inner spaces of two objects are connected in such a way as to communicate fluid, a fluid in the inner space of one of the objects may be conveyed into the inner space of the other object. In this case, the two objects are not necessarily connected directly to each other, they can be deemed to be connected in such a way as to communicate fluid even if they are connected indirectly via piping, a flow path, etc. in between.

An inlet of a flow path mentioned below may refer to a portion in the flow path through which fluid enters. Also, an outlet of the flow path may refer to a point where the flow path ends, i.e., a portion through which a fluid conveyed through the flow path escapes the flow path.

Hereinafter, fluids for temperature regulation may be divided into a main temperature regulating fluid and an auxiliary temperature regulating fluid depending on an associated component. In this instance, the same type of refrigerant may be used as the main temperature regulating fluid and the auxiliary temperature regulating fluid. For example, the refrigerant may be liquid nitrogen. The liquid nitrogen is conveyed to a device and vaporized during a temperature load test, and is able to absorb thermal energy. If the refrigerant is liquid nitrogen, a high-pressure storage tank for storing liquid nitrogen may be provided as a fluid supply source that preserves the liquid nitrogen.

Hereinafter, the present disclosure will be described with reference to the drawings for explaining a system for testing the performance of a device according to an embodiment of the present disclosure. FIG. 1 is a view illustrating a system for testing the performance of a device according to an embodiment of the present disclosure.

As illustrated in FIG. 1, a device performance test system 1 according to an embodiment of the present disclosure may include a tester 160, a fluid supply part 200, and a pusher 800.

The tester 160 may be a unit that performs a test on a device. Here, the device may be such an element as a semiconductor device, a semiconductor module, or an SSD that performs an electrical function. The tester 160 may conduct a temperature load test to check whether a device functions normally, for example, in a temperature environment of 70° C. below zero to 150° C. above zero.

To this end, the tester 160 may have a plurality of sockets 161 into which devices can be inserted. A contact terminal 162 (see FIG. 2) electrically connected to an inserted device may be disposed inside each socket 161. During a temperature load test, the tester 160 may determine whether the device operates normally while exchanging signals with the device through the contact terminal 162.

The tester 160 may further include a socket guide 163 which guides an insertion position of a device so that the device is inserted into a correction position in a socket 161. The socket guide 163 may correspond to an arrangement of the plurality of sockets 161, be somewhat larger than a cross-sectional shape of the socket 161, and guide an insert 131 (see FIG. 2) to be described later.

The fluid supply part 200 may be attached to an upper end of the pusher 800. For example, the fluid supply part 200 may be provided in the shape of a hood attached to the upper end of the pusher 800. A first duct 211 and a second duct 212 may be formed on one side of the fluid supply part 200 to receive a fluid for temperature regulation from an external fluid supply source (not shown). In this case, although not shown, the ducts 211 and 212 may be connected to the fluid supply source through a bellows tube.

The fluid supply part 200 may supply a fluid for temperature regulation into the pusher 800 through the upper end of the pusher 800. More specifically, the fluid supply part 200 may deliver to the pusher 800 a refrigerant supplied to the ducts 211 and 212 along a transfer pathway formed inside it. In this case, the fluid supplied to the ducts 211 and 212 will be hereinafter referred to as a main temperature regulating fluid for convenience sake.

The pusher 800 may be a unit that presses a plurality of devices transferred to its bottom in the direction of the sockets. The pusher 800 may cause a device to be attached firmly to a socket 161 during a test. In this instance, the devices 20 may be transferred to the bottom of the pusher 800 through a separate handler (not shown), a transfer machine (not shown), etc.

A plurality of push bodies 820 (see FIG. 2) may be formed at a lower end of the pusher 800, which protrude from a position corresponding to each socket 161. The push bodies 820 may be shaped in such a way that their center extends downward. For example, the push bodies 820 may be roughly similar in shape to a flat plate-like member with a column positioned at the center of their underside. A cross-section of the push bodies 820 may be roughly identical or similar to a T-shape. The push bodies 820 may press down a device transferred to their bottom side using their bottom end.

Although not shown, the pusher 800 may be configured to be lifted and lowered by including an actuator (not shown). For example, the actuator may be implemented as a variety of components that are connected to the fluid supply part 200 and/or the pusher 800 to lift or lower the pusher 800. By the lifting and lowering motion of the pusher 800, the push bodies 820 may be lowered to press the devices or lifted to release the devices.

In this case, even if the fluid supply part 200 is lifted or lowered together with the pusher 800, the ducts 211 and 212 may be connected to a fluid supply source without loss of fluid by means a bellows tube. More specifically, the bellows tube expands or contracts as the fluid supply part 200 is lifted or lowered, and is able to maintain a seal against fluid.

Meanwhile, a plurality of supply pipes 810 may be formed on a side of the pusher 800. The supply pipes 810 may receive refrigerant from a separate fluid supply source and deliver it to the inside of the pusher 800. For convenience sake, the refrigerant delivered to the supply pipes 810 is referred to as an auxiliary temperature regulating fluid.

Figure 2:
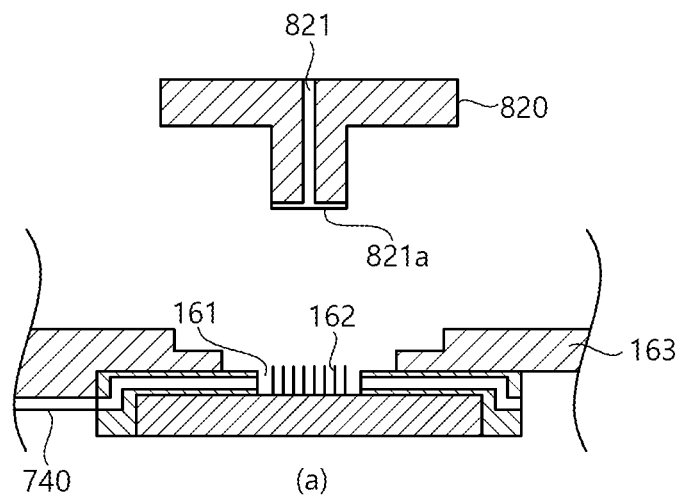
FIG. 2 is a view depicting a process in which a device is mounted to a socket.
Figure 2:
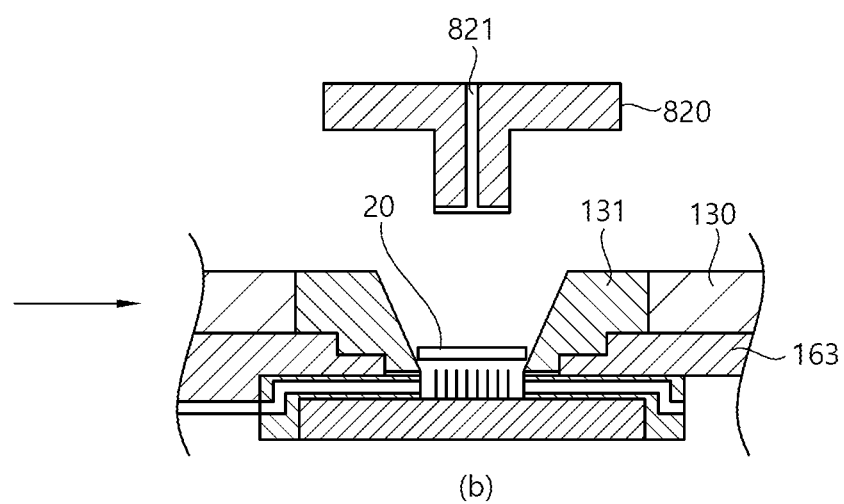
Figure 2:
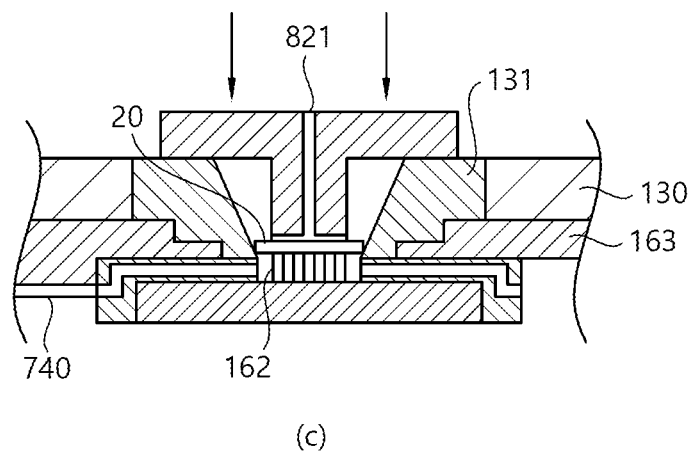

The description will be continued with reference to FIG. 2. FIG. 2 is a view depicting a process in which a device is mounted to a socket.

More specifically, (a) of FIG. 2 depicts a pusher positioned at an initial height. As illustrated in (a) of FIG. 2, a jet flow path 821 may be formed inside the push body 820. The jet flow path 821 may extend along a height direction of the push body 820, and is able to jet a main temperature regulating fluid and an auxiliary temperature regulating fluid supplied into the pusher 800 through a discharge opening 821a at the bottom.

Meanwhile, the tester 160 may have a tester cooling flow path 740 which extends into the socket 161. The tester cooling flow path 740 may receive the auxiliary temperature regulating fluid, which will be described later.

(b) of FIG. 2 depicts a device loaded on the top of the tester by means of a handler, a transfer machine, etc. used for a separate purpose. Although not shown in detail, the device 20 may be loaded onto a tray 130 and transferred to the top of the tester 160.

The tray 130 may have a plurality of devices 20 loaded thereon, and may include inserts 131 by which each device 20 is inserted. Each insert 131 is capable of loading each device 20 individually and preventing the loaded device 20 from falling out. The number and arrangement of inserts 131 formed on the tray 130 may correspond to the number and arrangement of sockets 161 formed on the tester 160. The inserts 131 may be configured to be slightly moveable on the tray 130. Because of this space for movement, the insert 131 may be firmly attached to a correct position along the socket guide 163 as it is pressed along with the device 20 by the pusher 800.

(c) of FIG. 2 is a view depicting a device pressed by the pusher. The tray 130 may be mounted on the tester 160 as in (b) of FIG. 2, and then the push body 820 may press the device 20 as the pusher 800 is lowered as in (c) of FIG. 2. The device 20 shown in (c) of FIG. 2 may be electrically connected to the contact terminal 162, and a temperature load test may be performed by the tester 160.

During the temperature load test, the temperature load test environment may be maintained at a certain temperature due to the refrigerant supplied to the jet flow path 821 and the tester cooling flow path 740. This will be described in detail later.

Figure 3A:
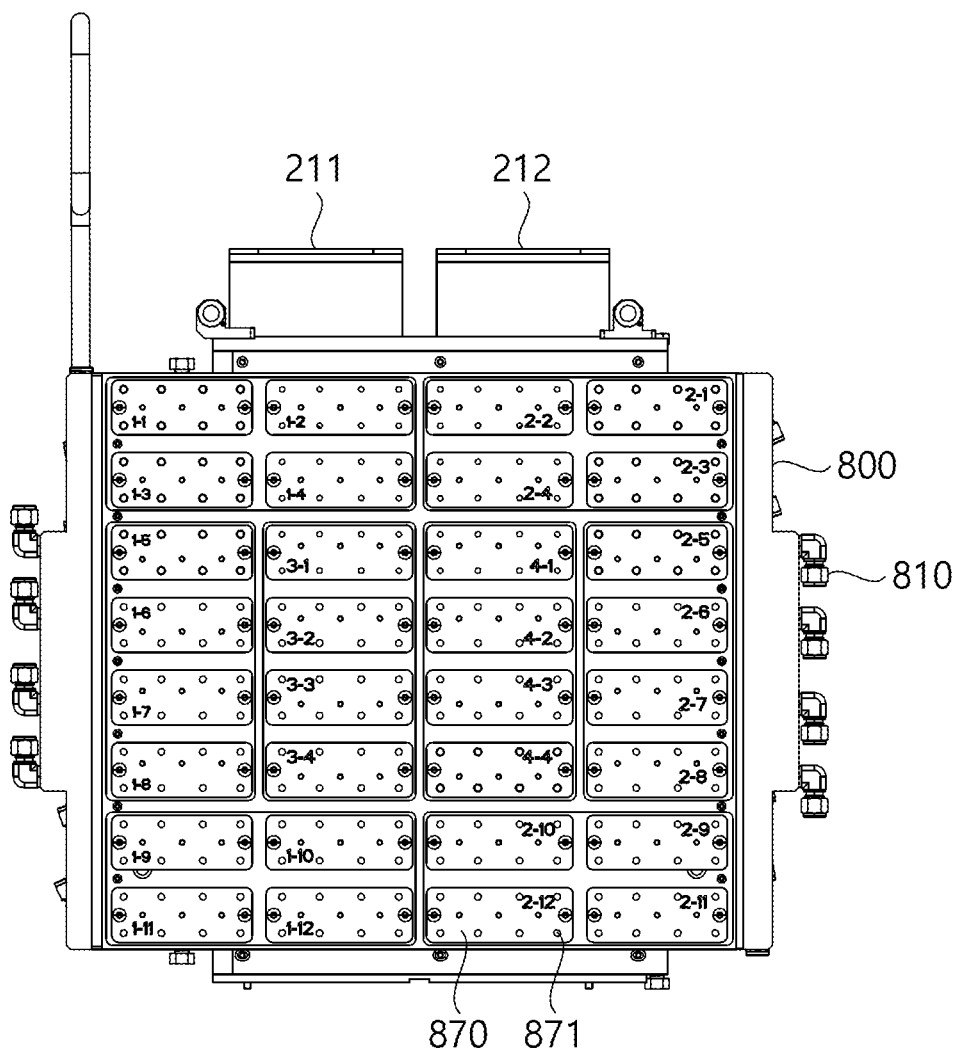
FIG. 3A is a view illustrating the underside of the pusher from which the push bodies and a match plate are removed, according to an embodiment of the present disclosure.
Figure 3B:
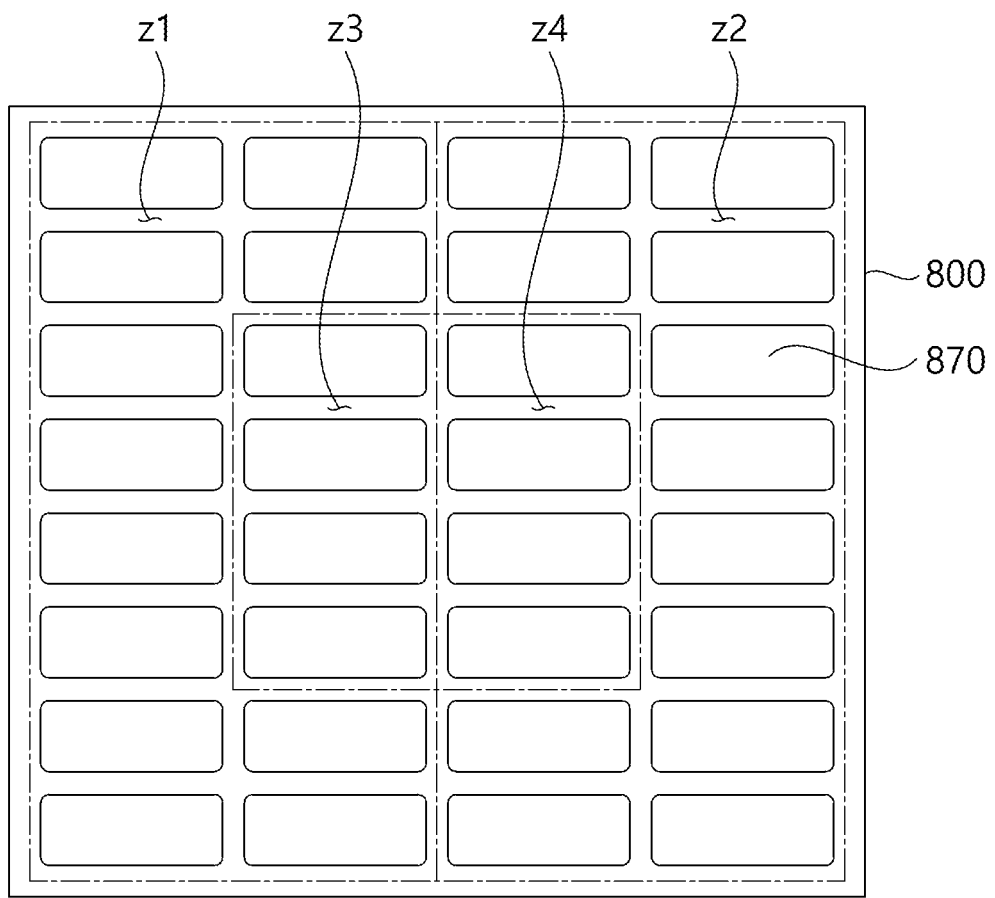
FIG. 3B is a view depicting a plurality of regions in a schematic representation of FIG. 3A.

Hereinafter, a fluid supply structure of the present disclosure will be described in detail with reference to FIGS. 3A to 8. First, FIG. 3A is a view illustrating the underside of the pusher from which the push bodies and a match plate are removed, according to an embodiment of the present disclosure. FIG. 3B is a view depicting a plurality of regions in a schematic representation of FIG. 3A. Here, the match plate

830 (FIGS. 6 to 8) may be a plate-like member where the push bodies 820 are mounted, and a detailed description of it will be given later.

Referring to FIGS. 3A and 3B, a system for testing the performance of a device according to an embodiment of the present disclosure may be configured in a plurality of regions z1, z2, z3, and z4 defined between the pusher 800 and the tester 160 in such a way as to adjust a fluid supplied to each of the regions z1, z2, z3, and z4. Each region z1, z2, z3, and z4 may be supplied with fluid individually through different supply pipes 810.

For example, as shown in FIGS. 3A and 3B, the present disclosure allows control of fluid supply by dividing a space between the pusher 800 and the tester 160 largely into four regions z1, z2, z3, and z4. It is to be noted that what is illustrated in FIG. 3B is merely exemplary, and the shape and number of regions in which the fluid supply is controlled may be varied as necessary.

The first region z1 and the second region z2 may be symmetrical in shape, and the third region z3 and the fourth region z4 may be symmetrical in shape. For example, cross-sections of the first region z1 and the second region z2 which are formed by cutting through them in a direction perpendicular to their height may have a shape similar to "Π", and the third region z3 and the fourth region z4 may be a roughly rectangular space.

The first region z1 and the second region z3 may be an outer part of the space between the tester 160 and the pusher 800, and the third region z3 and the fourth region z4 may be an area that is enclosed by the first region z1 and the second region z2 and corresponds to a central part of the space between the tester 160 and the pusher 800. More specifically, the third region z3 may be positioned at a center side of the first region z1, the fourth region z4 may be positioned next to the third region z3, and the second region z2 may enclose part of the fourth region z4.

The combined area of the first region z1 and the third region 3 and the combined area of the second region z2 and the fourth region z4 may be of equal volume and symmetrical in shape. That is, half the space between the tester 160 and the pusher 800 may correspond to the combined area of the first region z1 and the third region z3, and the other half may correspond to the combined area of the second region z2 and the fourth region z4.

With the push bodies 820 and the match plate 830 removed, a plurality of diffusion plates 870 may be positioned on the underside of the pusher 800. The plurality of diffusion plates 870 may be secured to a housing of the pusher 800 by using a fastener or the like. In this instance, the diffusion plates 870 may be tightly attached to the housing of the pusher 800 so that fluid is not lost from inside the pusher 800 except from fluid conveying holes 871.

Although not illustrated in FIGS. 3A and 3B, the match plate 830 (see FIGS. 6 to 8) may be disposed under the plurality of diffusion plates 870. More specifically, the match plate 830 may have a size corresponding to the underside of the pusher 800 illustrated in FIG. 3A, and be therefore mounted to the pusher 800 such that the plurality of diffusion plates 870 are not seen from the outside.

With the match plate 830 being mounted to the housing of the pusher 800, a space may be formed between the match plate 830 and the plurality of diffusion plates 870, in which a fluid conveyed from the diffusion plates 870 is diffused. To this end, the match plate 830 may be attached to the pusher 800 at a certain distance from the plurality of diffusion plates 870.

Meanwhile, a plurality of jet slots 831 (see FIGS. 6 to 8) may be formed on the match plate 830. Each push body 820 may be attached to the bottom of the match plate 830 so that the jet flow path 821 fits one of the jet slots 831. With the push body 820 being attached to the pusher 800, the jet flow path 821 and the jet slot 831 may communicate with each other, and a fluid conveyed to the jet slot 831 may be jetted out through the jet flow path 821.

For example, the push bodies 820 may be fastened with a separate fastener or the like to the bottom of the match plate 830. In a manner similar to the diffusion plates 870, the match plate 830 and the push bodies 820 may be tightly attached so as to prevent fluid from being lost.

Meanwhile, the plurality of diffusion plates 870 may be allocated to each of the regions z1, z2, z3, and z4. For example, twelve diffusion plates 870 may be allocated to the first region z1 and the second region z2 each, and four diffusion plates 870 may be allocated to the third region z3 and the fourth region z4 each.

The diffusion plates 870 allocated to the same region may have the same or similar fluid supply structure. Due to this, the amounts of fluid jetted from the diffusion plates 870 allocated to the same region may be regulated, not individually but collectively.

Figure 4:
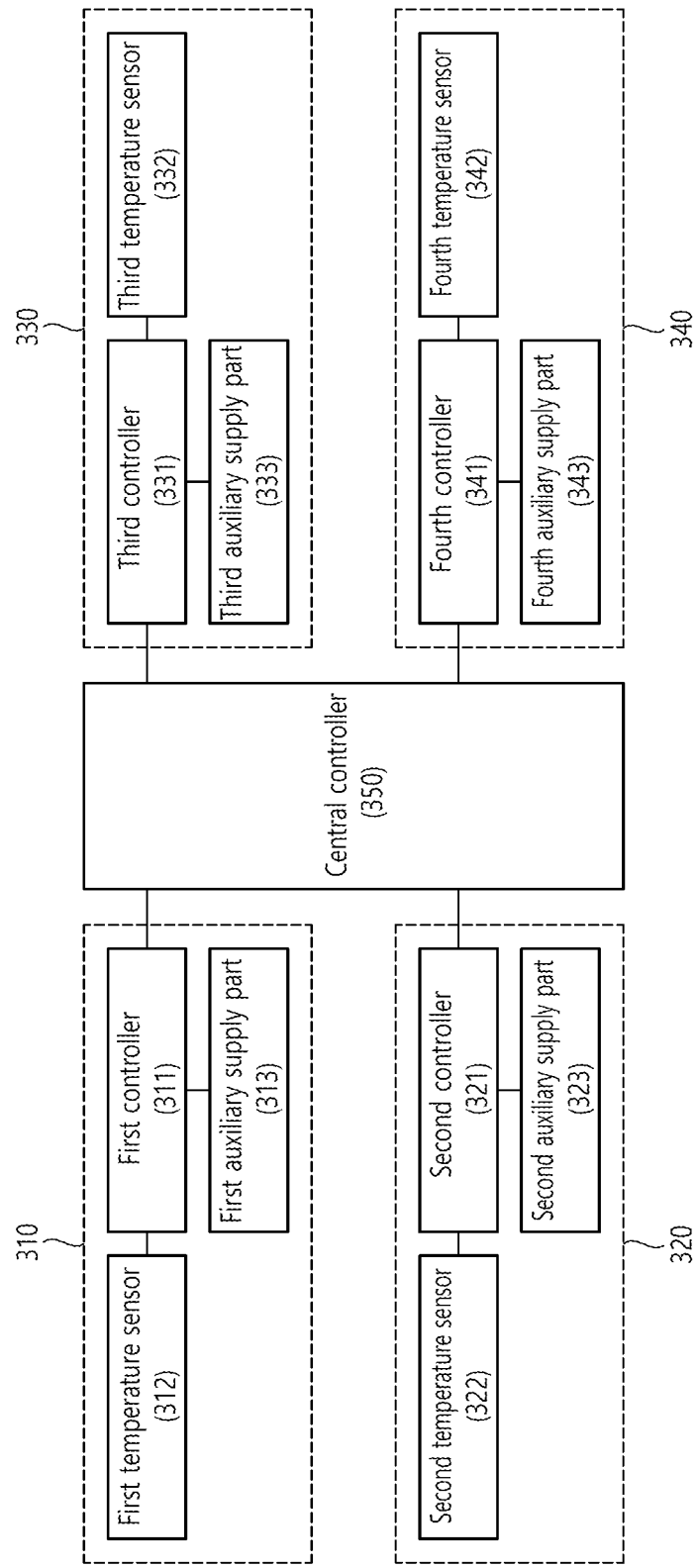
FIG. 4 is a block diagram of a temperature regulator in a system for testing the performance of a device according to an embodiment of the present disclosure.

The description will be continued with reference to FIG. 4. FIG. 4 is a block diagram of a temperature regulator in a system for testing the performance of a device according to an embodiment of the present disclosure.

As illustrated in FIG. 4, the system for testing the performance of a device according to an embodiment of the present disclosure may include a central controller 350, a first temperature regulator 310, a second temperature regulator 320, a third temperature regulator 330, and a fourth temperature regulator 340.

The central controller 350 may send and receive signals to and from a user's interface, and control the first temperature regulator 310, the second temperature regulator 320, the third temperature regulator 330, and the fourth temperature regulator 340, in response to an input signal.

For example, the user may enter a testing condition for a temperature load test via an interface, and the central controller 350 may control the first temperature regulator 310, the second temperature regulator 320, the third temperature regulator 330, and the fourth temperature regulator 340 so that the testing condition is met and maintained.

More specifically, the user may enter a predetermined temperature range as the testing condition. For example, the temperature range may be a temperature range for which upper and lower limits are set, or may be a specified temperature itself regardless of what the term suggests.

The first temperature regulator 310 may regulate the temperature of the first region z1 (see FIG. 3B) to be maintained within a predetermined temperature range. The first temperature regulator 310 may include a first controller 311, a first temperature sensor 312, and a first auxiliary supply part 313.

The first controller 311 is a control unit that receives information on a testing condition from the central controller 350 and controls the first auxiliary supply part 313 based on the received information and measurements from the first temperature sensor 312.

The first temperature sensor 312 is a component for measuring the temperature of the first region z1, which may be provided as a variety of conventional temperature sensors such as contact type and contactless type. For example, the first temperature sensor 312 may be disposed at one of the sockets 161 positioned within the first region z1 and sense the temperature inside that socket 161. Alternatively, the first temperature sensor 312 may detect the temperature of the first region z1 by coming into contact with the push bodies 820 and measuring the temperatures of the push bodies 820.

Meanwhile, the first auxiliary supply part 313 is a unit for supplying an auxiliary temperature regulating fluid to a first auxiliary flow path to be described later. The first auxiliary supply part 313 may include a separate fluid supply source, a supply pipe 810 connected to the fluid supply source, and a servo valve which regulates the flow rate inside the supply pipe 810 in response to a signal from the first controller 311.

The first controller 311 may receive and read measurements from the first temperature sensor 312 on a periodical basis. Alternatively, the first controller 311 may transmit information on a predetermined temperature range to the first temperature sensor 312, and the first temperature sensor 312 may transmit a deviation signal to the first controller 311 if a measurement deviates from the predetermined temperature range.

If a periodically received signal deviates from the predetermined temperature range, or upon receiving a deviation signal, the first controller 311 may regulate the flow rate of the first auxiliary supply part 313 so that the temperature of the first region z1 falls back into the predetermined temperature range.

If the first region z1 is overcooled, the first controller 311 may transmit a control signal to the first auxiliary supply part 313 to decrease the flow rate, and if the first region z1 is overheated, the first controller 311 may transmit a control signal to the first auxiliary supply part 313 to increase the flow rate. The servo valve in the first auxiliary supply part 313 may change the flow rate of the supply pipe 810 in response to a received control signal.

Once the supply flow rate of the first auxiliary supply part 313 is regulated, the amount of fluid flowing out of the diffusion plates 870 allocated to the first region z1 is also regulated, whereby the total amount of refrigerant supplied to the first region z1 may be changed.

Hereinafter, the second temperature regulator 320, the third temperature regulator 330, and the fourth temperature regulator 340 will be described briefly based on the description of the first temperature regulator 310. In this case, although the first temperature regulator 310, the second temperature regulator 320, the third temperature regulator 330, and the fourth temperature regulator 340 are provided separately with respect to the regions z1, z2, z3, and z4 for temperature management, they may have a similar structure.

The second temperature regulator 320 may be configured to regulate the temperature of the second region z2. Similarly to the first temperature regulator 310, the second temperature regulator 320 may include a second controller 321, a second temperature sensor 322, and a second auxiliary supply part 323.

Similarly to the first controller 311, the second controller 321 is a control unit that receives information on a testing condition from the central controller 350 and controls the second auxiliary supply part 323 based on the received information and measurements from the second temperature sensor 322. The second temperature sensor 322 may be configured to measure the temperature of the second region z2. The second auxiliary supply part 323 may be configured to supply an auxiliary temperature regulating fluid to the pusher 800 under control of the second controller 321, independently from other auxiliary supply parts. Other details of the second temperature regulator 320 may be similar to those of the first temperature regulator 310, so redundant explanation will be omitted.

The third temperature regulator 330 may be configured to regulate the temperature of the third region z3. Similarly to the first temperature regulator 310, the third temperature regulator 330 may include a third controller 331, a third temperature sensor 332, and a third auxiliary supply part 333.

Similarly to the first controller 311, the third controller 331 is a control unit that receives information on a testing condition from the central controller 350 and controls the third auxiliary supply part 333 based on the received information and measurements from the third temperature sensor 332. The third temperature sensor 332 may be configured to measure the temperature of the third region z3. The third auxiliary supply part 333 may be configured to supply an auxiliary temperature regulating fluid to the pusher 800 under control of the third controller 331, independently from other auxiliary supply parts. Other details of the third temperature regulator 330 may be similar to those of the first temperature regulator 310, so redundant explanation will be omitted.

The fourth temperature regulator 340 may be configured to regulate the temperature of the fourth region z4. Similarly to the first temperature regulator 310, the fourth temperature regulator 340 may include a fourth controller 341, a fourth temperature sensor 342, and a fourth auxiliary supply part 343.

Similarly to the first controller 311, the fourth controller 341 is a control unit that receives information on a testing condition from the central controller 350 and controls the fourth auxiliary supply part 343 based on the received information and measurements from the fourth temperature sensor 342. The fourth temperature sensor 342 may be configured to measure the temperature of the fourth region z4. The fourth auxiliary supply part 343 may be configured to supply an auxiliary temperature regulating fluid to the pusher 800 under control of the fourth controller 341, independently from other auxiliary supply parts. Other details of the fourth temperature regulator 340 may be similar to those of the first temperature regulator 310, so redundant explanation will be omitted.

Although not shown, the first to fourth temperature regulators 310, 320, 330, and 340 may control the first to fourth auxiliary supply parts 313, 323, 333, and 343 as necessary so that refrigerant is supplied from the tester cooling flow path 740 as well as from the pusher 800.

More specifically, the first to fourth temperature regulators 310, 320, 330, and 340 may supply an auxiliary temperature regulating fluid only to the pusher 800 if the temperature of the region z1, z2, z3, and z4 they are in charge of requires a slight compensation.

On the contrary, in the case of rapid temperature control and/or a large temperature deviation, the first to fourth temperature regulators 310, 320, 330, and 340 may allow the auxiliary temperature regulating fluid to be supplied from the tester cooling flow path 740 as well. To this end, the first to fourth auxiliary supply parts 313, 323, 333, and 343 may include a servo valve which regulates the flow rate of the tester cooling flow path 740 in the respective regions z1, z2, z3, and z4 in response to a signal from the first to fourth controllers 311, 321, 331, and 341.

Figure 5:
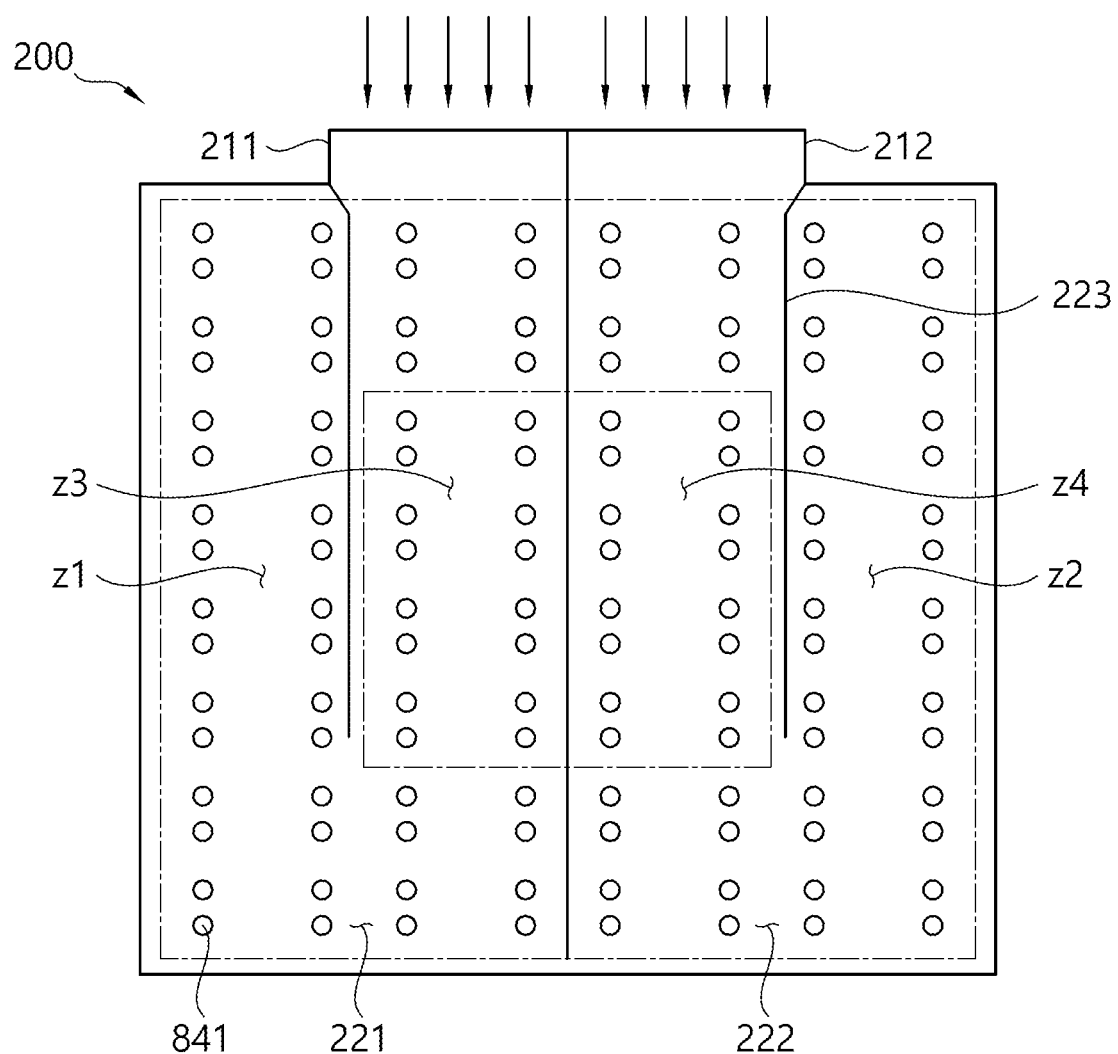
FIG. 5 is a view schematically depicting the inside of a fluid supply part according to an embodiment of the present disclosure.

In another example, the tester cooling flow path 740 may be configured to continuously supply a main temperature regulating fluid like the pusher 800 does, as will be described below. In this instance, the fluid may be conveyed to the device 20 through the tester cooling flow path 740 at a flow rate set by the central controller 350 according to a testing condition Hereinafter, a main temperature regulating fluid supply structure for the device performance test system 1 according to an embodiment of the present disclosure will be described with reference to FIG. 5. FIG. 5 is a view schematically depicting the inside of a fluid supply part according to an embodiment of the present disclosure.

As illustrated in FIG. 5, a first fluid distribution chamber 221 communicating with a first duct 211 and a second fluid distribution chamber 222 communicating with a second duct 212 may be formed inside the fluid supply part 200. The first fluid distribution chamber 221 and the second fluid distribution chamber 222 may be provided as a groove formed in the fluid supply part 200.

Meanwhile, a plurality of supply flow paths 841 communicating with the pusher 800 may be formed at the bottoms of the first fluid distribution chamber 221 and the second fluid distribution chamber 222. These supply flow paths 841 may be divided into a first supply flow path, a second supply flow path, a third supply flow path, and a fourth supply flow path depending on the regions z1, z2, z3, and z4 allocated to them. More specifically, the supply flow path 841 through which a main temperature regulating fluid is supplied to the first region z1 is referred to as the first supply flow path. Likewise, the supply flow path 841 through which the main temperature regulating fluid is supplied to the second region z2 is referred to as the second supply flow path. Likewise, the supply flow path 841 through which the main temperature regulating fluid is supplied to the third region z3 is referred to as the third supply flow path. Likewise, the supply flow path 841 through which the main temperature regulating fluid is supplied to the fourth region z4 is referred to as the fourth supply flow path.

In the first fluid distribution chamber 221, a partition wall 223 extending to the inside from the first duct 211 may be disposed. When viewed from above, the partition wall 223 may extend almost all the way to an end portion of the third region z3. Likewise, in the second fluid distribution chamber 222, a partition wall 223 extending to the inside from the second duct 212 may be disposed. When viewed from above, the partition wall 223 may extend almost all the way to an end portion of the fourth region z4.

By means of these partition walls 223, the main temperature regulating fluid introduced into the first duct 211 and the second duct 212 may be diffused as it swirls inside the first fluid distribution chamber 221 and the second fluid distribution chamber 222. The main temperature regulating fluid thus diffused may be supplied to the pusher 800 through the supply flow path 841 on the underside. Due to this, a uniform amount of main temperature regulating fluid may be admitted into each supply flow path 841. The main temperature regulating fluid may be continuously supplied to the first to fourth regions z1, z2, z3, and z4 during a temperature load test.

For example, when the user enters a command to start the temperature load test, the main temperature regulating fluid may be supplied to the first duct 211 and the second duct 212 so that a testing condition is met. Hereinbelow, a component for supplying the main temperature regulating fluid to the first duct 211 and the second duct 212 and regulating the amount of main temperature regulating fluid supplied according to the testing condition will be referred to as a main temperature regulator (not shown).

The main temperature regulator also may supply the main temperature regulating fluid to the first duct 211 and the second duct 212 under control of the central controller 350. To this end, the main temperature regulator may include a servo valve that is disposed on a flow path connecting the first duct 211 and the second duct 212 to an external fluid supply source. The servo valve may regulate the flow rate inside the flow path in response to a control signal from the central controller 350. The central controller 350 may transmit a control signal corresponding to a set testing condition to the main temperature regulator, and the amount of fluid supplied per time by the main temperature regulator may correspond to the received control signal.

Hereinafter, a fluid supply structure inside the pusher will be described with reference to FIGS. 6 to 8. First, FIG. 6 is a view illustrating a fluid supply structure for a temperature regulator according to an embodiment of the present disclosure.

Although the following description will be given with respect to the first temperature regulator 310 to avoid redundant explanation, the second temperature regulator 320, the third temperature regulator 330, and the fourth temperature regulator 340 also may include the fluid supply structure which the first temperature regulator 310 includes inside the pusher 800.

Figure 6:
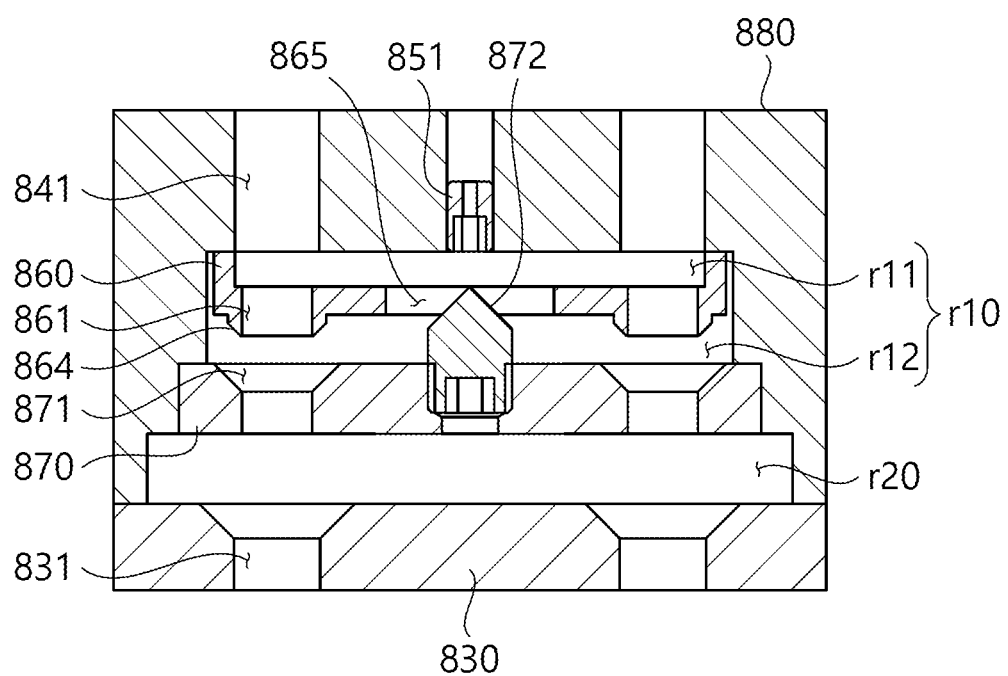
FIG. 6 is a view illustrating a fluid supply structure for a temperature regulator according to an embodiment of the present disclosure.

The only difference between them may be that the first temperature regulator 210 has the structure illustrated in FIG. 6 on top of the diffusion plates 870 allocated to the first region z1, the second temperature regulator 220 has the structure illustrated in FIG. 6 on top of the diffusion plates 870 allocated to the second region z2, the third temperature regulator 230 has the structure illustrated in FIG. 6 on top of the diffusion plates 870 allocated to the third region z3, and the fourth temperature regulator 240 has the structure illustrated in FIG. 6 on top of the diffusion plates 870 allocated to the fourth region z4. Moreover, a component prefixed by an ordinal number "first" can be prefixed by ordinal numbers "second", "third, and "fourth" as well, in the case of the second to fourth temperature regulators.

As illustrated in FIG. 6, the first temperature regulator 310 may include a first supply flow path 841, a first auxiliary flow path 851, a backflow preventing member 860, and a first fluid diffusion chamber r10.

The first supply flow path 841 may communicate with the fluid supply part 200, and may supply a main temperature regulating fluid into the first fluid diffusion chamber r10. The first supply flow path 841 may be formed in a housing 880 of the pusher 800, with an inlet positioned on the underside of the fluid supply part 200, and an outlet positioned on an upper surface of the first fluid diffusion chamber r10. The outlet of the first supply flow path 841 may be an intake opening through which the main temperature regulating fluid enters, from the viewpoint of the first fluid diffusion chamber r10.

The first auxiliary flow path 851 may be a flow path that communicates directly with the first auxiliary supply part 313 to be supplied with an auxiliary temperature regulating fluid. In this case, the second auxiliary flow path 851 may communicate with the second auxiliary supply part 323, the third auxiliary flow path 851 may communicate with the third auxiliary supply part 333, and the fourth auxiliary flow path 851 may communicate with the fourth auxiliary supply part 343.

An outlet of the first auxiliary flow path 851 may be positioned on the upper surface of the first fluid diffusion chamber r10. In this case, the outlet of the first auxiliary flow path 851 may be an intake opening through which the auxiliary temperature regulating fluid enters, from the viewpoint of the first fluid diffusion chamber r10.

The backflow preventing member 860 may be disposed inside the first fluid diffusion chamber r10 and divide the first fluid diffusion chamber r10 into a first upper fluid diffusion chamber r11 and a first lower fluid diffusion chamber r12. The backflow preventing member 860 may be formed with a fluid communicating hole 861 to allow fluid communication between the first upper fluid diffusion chamber r11 and the first lower fluid diffusion chamber r12.

The backflow preventing member 860 may have a backflow preventing projection 864 which is a downward protruding portion around a lower end of the fluid communicating hole 861. The backflow preventing member 864 may protrude from the underside of the backflow preventing member 860, along the direction in which the fluid communicating hole 861 extends (the height direction of the backflow preventing member).

Moreover, the backflow preventing member 860 may be formed with a center hole 865 that is positioned immediately below the auxiliary flow path 851. A fluid admitted to the first upper fluid diffusion chamber r11 through the first auxiliary flow path 851 may be diffused to the first lower fluid diffusion chamber r12 via the center hole 865. For example, the center hole 865 may be a circular hole.

The diffusion plate 870 may separate the first fluid diffusion chamber r10 and a diffusion distribution chamber r20, and include a fluid conveying hole 871 and a projecting member 872. The fluid conveying hole 871 may be formed immediately below the fluid communicating hole 861, and the projecting member 872 may be positioned immediately below the center hole 865. An upper end of the projecting member 872 may be sharp-pointed and have the shape of a horn that slopes downward. The projecting member 872 may be of a height that allows the upper end to fit into the center hole 872.

The diffusion distribution chamber r20 may be formed by a gap between the plurality of diffusion plates 870 and the match plate 830. To form this gap, the housing 880 may be formed with a groove corresponding to a cross-sectional shape of the match plate 830, the plurality of diffusion plates 870 may be positioned under the groove, and the match plate 830 may be positioned over the groove.

Fluid discharged through the fluid conveying holes 871 of each region z1, z2, z3, and z4 may be diffused inside the diffusion distribution chamber r20 and then conveyed down to the jet slot 831.

In a case where none of the temperature regulators is supplying the auxiliary temperature regulating fluid, the main temperature regulating fluid may be diffused sequentially through the fluid distribution chambers 221 and 222 (see FIG. 5), the fluid diffusion chamber r10, and the diffusion distribution chamber 320, and then admitted to the plurality of jet slots 831. Due to this, the amount of fluid conveyed through each jet slot 831 may be equal or relatively uniform.

In a case where the auxiliary temperature regulating fluid is supplied, the amount of fluid flowing through each jet slot 831 may be associated with the region z1, z2, z3, or z4 where the jet slot 831 is positioned, which is managed by the corresponding temperature regulator (first, second, third, or fourth temperature regulator).

That is, although the amount of auxiliary temperature regulating fluid flowing to every jet slot 831 may not be uniform since it is low diffused in relatively, the amount of fluid flowing from the jet slots 831 in the same region z1, z2, z3, and z4 may be similar.

The first fluid diffusion chamber r10 and the diffusion distribution chamber r20 may be formed by a groove formed in the housing 880 of the pusher 800.

The backflow preventing member 860 and the diffusion plate 870 may be roughly rectangular. In this case, the backflow preventing member 860 may be formed with a plurality of fluid communicating holes 861 and a center hole 865, and the diffusion plate 870 may be formed with a plurality of fluid conveying holes 871 and a plurality of projecting members 872. Also, a plurality of backflow preventing members 860 and a plurality of diffusion plates 870 may be disposed above the match plate 830.

The second temperature regulator 320 may include a second supply flow path 841, a second auxiliary flow path 851, a backflow preventing member 860, a second diffusion chamber 870, and a second fluid diffusion chamber r10. The third temperature regulator 340 may include a third supply flow path 841, a third auxiliary flow path 851, a backflow preventing member 860, a third diffusion plate 870, and a third fluid diffusion chamber r10. The fourth temperature regulator 340 may include a fourth supply flow path 841, a fourth auxiliary flow path 851, a backflow preventing member 860, a fourth diffusion plate 870, and a fourth fluid diffusion chamber r10. A fluid supply structure of the second to fourth temperature regulators 320, 330, and 340 is similar to what has been described with respect to the first temperature regulator 310, so a description thereof will be omitted.

Figure 7:
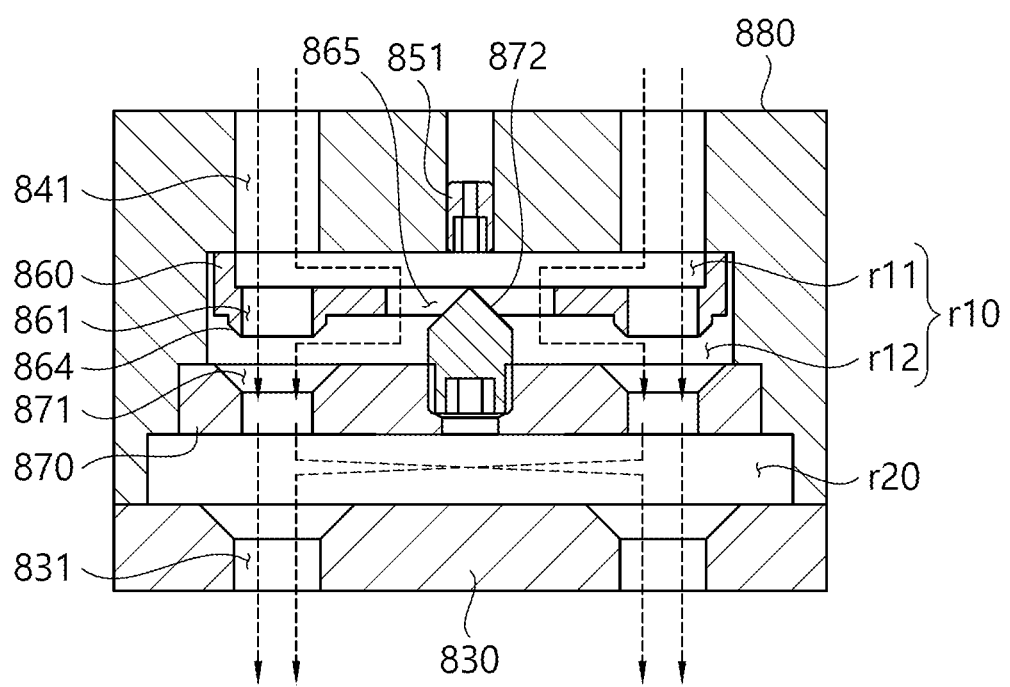
FIG. 7 is a view depicting a main temperature regulating fluid being diffused inside the pusher.

FIG. 7 is a view depicting a main temperature regulating fluid being diffused inside the pusher. As illustrated in FIG. 7, the main temperature regulating fluid admitted to the first upper fluid diffusion chamber r11 through the supply flow path 841 flows as indicated by the arrows in FIG. 7, and is finally conveyed to the jet flow path 821 formed in the push body 820 through the jet slot 831.

First, the main temperature regulating fluid admitted to the first upper fluid diffusion chamber r11 may be diffused for the first time and then flow to the first lower fluid diffusion chamber r12 through the fluid communicating hole 861 and the center hole 865. Afterwards, the main temperature regulating fluid may be diffused for the second time in the first lower fluid diffusion chamber r12 and conveyed to the diffusion distribution chamber r20 through the fluid conveying hole 871. The main temperature regulating fluid may be finally diffused through the diffusion distribution chamber r20 and then flow to the jet flow path 821 through the jet slot 831.

In this manner, in the present disclosure, the main temperature regulating fluid may be gradually diffused so that a relatively uniform amount of refrigerant is supplied from every push body 820.

Meanwhile, the fluid conveying hole 871 and the jet slot 831 may have a larger cross-sectional area at their upper ends than at their lower ends, whereby the fluid flowing to the inside may be conveyed to the outlet and accelerated.

In the foregoing description, the fluid communicating hole 861, the fluid conveying hole 871, and the jet slot 831 have been illustrated as sharing the central axis and being positioned roughly on a straight line, but the present disclosure is not limited to this.

For example, at least one of the fluid communicating hole 861, the fluid conveying hole 871, and the jet slot 831 may be disposed on a different central axis, and therefore the at least one may be positioned to intersect the others when viewed from above. In this case, with the intersections of the fluid communicating hole 861, the fluid conveying hole 871, and the jet slot 831, fluid is kept from being jetted to the jet slot 831 along a straight line path. This may cause the fluid from being diffused within the first upper fluid diffusion chamber r11, the first lower fluid diffusion chamber r12, and the diffusion distribution chamber r20.

Figure 8:
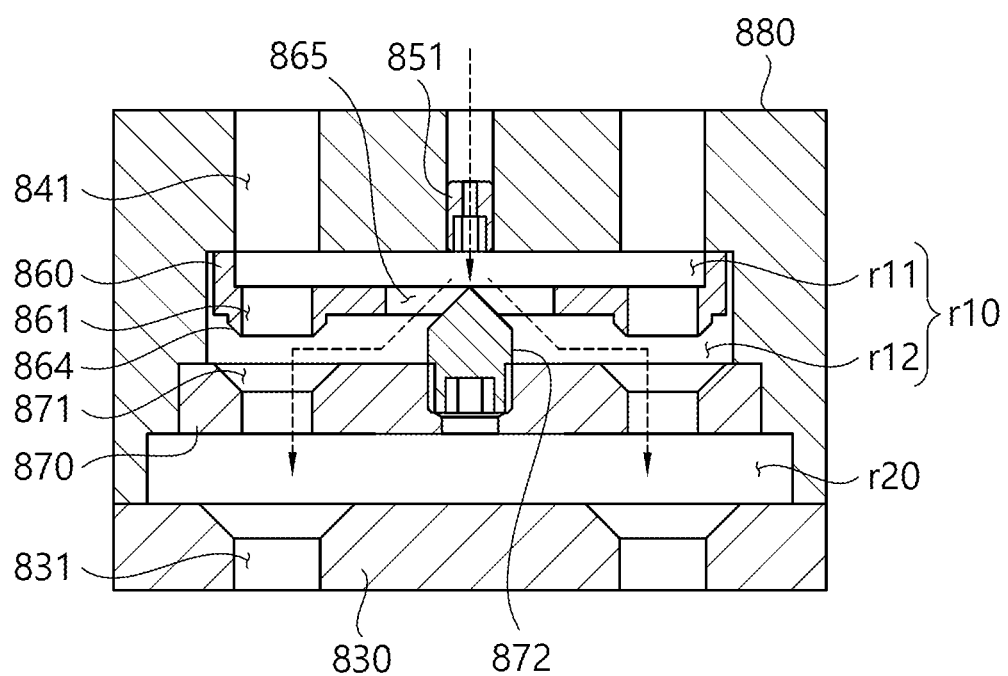
FIG. 8 is a view depicting how an auxiliary temperature regulating fluid is supplied.

FIG. 8 is a view depicting how an auxiliary temperature regulating fluid is supplied. Although the flow of the main temperature regulating fluid is omitted in FIG. 8, the main temperature regulating fluid may still be flowing as in FIG. 7.

As illustrated in FIG. 8, the auxiliary temperature regulating fluid may enter the first upper fluid diffusion chamber r11 through the auxiliary flow path 851 and then immediately enter the first lower fluid diffusion chamber r12 via the center hole 865. That is, the auxiliary temperature regulating fluid is not mostly diffused in the first upper fluid diffusion chamber r11 but may enter the first lower fluid diffusion chamber r12.

As described above, if the temperature of a particular region z1, z2, z3, or z4 falls outside a temperature range for a testing condition, it may be selectively supplied by the first to fourth auxiliary supply parts. In this instance, the auxiliary temperature regulating fluid may have a higher flow velocity than the main temperature regulating fluid flowing in the lower fluid diffusion chamber r12. This may be because, unlike the main temperature regulating fluid, the auxiliary temperature regulating fluid is not diffused in the fluid distribution chambers 221 and 222 and/or the first upper fluid diffusion chamber r11, and is supplied at a high velocity for rapid temperature compensation.

The center hole 851 may prevent disruptions of smooth supply of fluid, including a backflow of the main temperature regulating fluid which occurs when an auxiliary temperature regulating fluid flowing at a high velocity is dispersed inside the first upper fluid diffusion chamber r11 and forms a vortex in the first upper fluid diffusion chamber r11.

Moreover, the projecting member 872 may prevent non-uniformity in the total flow of fluid conveyed through the fluid conveying hole 871 which is caused when an auxiliary temperature regulating fluid flowing at a high velocity hits the underside of the first lower fluid diffusion chamber r12 and then disperses in an arbitrary direction.

Since the projecting member 872 faces the outlet of the auxiliary flow path 851 (the intake opening for the auxiliary temperature regulating fluid), the auxiliary temperature regulating fluid may hit the surface of the projecting member 872 right after being conveyed to the lower fluid diffusion chamber r12 and be dispersed in an inner space of the lower fluid diffusion chamber r12.

In this case, a downward slope on the projecting member 872 may cause the auxiliary temperature regulating fluid to disperse as the auxiliary temperature regulating fluid flows mostly downward at an angle. More specifically, an upper end of the projecting member 872 may be at the same level as the intake opening (upper surface) of the center hole 865. Also, a downward sloping surface (not shown) which forms a downward slope from the upper end of the projecting member 872 may extend downward at an angle into the first lower fluid diffusion chamber r12, and the auxiliary temperature regulating fluid flowing along the sloping surface may be dispersed mostly inside the first lower fluid diffusion chamber r12.

Moreover, the central axis of the projecting member 872 may be positioned in the same straight line as the central axis of the auxiliary flow path 851 so that a uniform amount of auxiliary temperature regulating fluid is dispersed in all directions.

With the dispersion caused by the projecting member 872, the auxiliary temperature regulating fluid may be spread relatively uniformly inside the lower fluid diffusion chamber r12. The dispersed auxiliary temperature regulating fluid may be mixed with the main temperature regulating fluid and diffused inside the lower fluid diffusion chamber r12, be additionally diffused in the diffusion distribution chamber r20, and then be jetted through the jet flow path 821.

The backflow preventing member 860 may prevent the auxiliary temperature regulating fluid hitting the projecting member 872 from flowing back to the supply flow path 841 and disrupting the flow of the main temperature regulating fluid. Specifically, the backflow preventing member 860 may be disposed between the supply flow path 841 and the projecting member 872, and its body may therefore block off an inner space of the fluid diffusion chamber r10, thereby keeping the auxiliary temperature regulating fluid dispersed to the supply flow path 841 from entering.

Moreover, the backflow preventing projection 864 may protrude in a direction in which the fluid communicating hole 861 extends downward, such that the outlet of the fluid communicating hole 861 extends into an inner space of the lower fluid diffusion chamber r12, thereby preventing the auxiliary temperature regulating fluid dispersed to the side from entering the fluid communicating hole 861.

According to the present disclosure, even if a temperature non-uniformity occurs in some region during a temperature load test, the temperature sensor is able to measure it to immediately adjust the temperature. Owing to this, uniform temperature distribution may be maintained across all regions during the temperature load test. Also, refrigerant may be supplied from the plurality of push bodies at a relatively uniform flow rate, thereby preventing non-uniform temperature distribution caused by non-uniform supply of refrigerant.

Those skilled in the art will understand that the present disclosure can be implemented in other forms without changing the technical idea or essential features thereof. Therefore, it should be understood that the above-described embodiments are merely examples, and are not intended to limit the present disclosure. The scope of the present disclosure is defined by the accompanying claims rather than the detailed description, and the meaning and scope of the claims and all changes and modifications derived from the equivalents thereof should be interpreted as being included in the scope of the present disclosure.

What is claimed is:

1. A system for testing the performance of a device, the system comprising:
    a tester including a plurality of sockets capable of making electrical contact with a plurality of devices inserted therein, and testing performance of the devices;
    a pusher including a plurality of push bodies for pushing the devices in a direction of the sockets, by which the plurality of devices are inserted into the plurality of sockets;
    a first temperature regulator which is connected to a first region between the pusher and the tester and maintains a temperature of the first region within a predetermined temperature range during the test on the plurality of devices, the first region being a space between some of the plurality of sockets and the pusher; and
    a second temperature regulator which is connected to a second region between the pusher and the tester and maintains the temperature of the second region within a predetermined temperature range during the test on the plurality of devices, the second region being a space between some other sockets and the pusher.

2. The system of claim 1, wherein the plurality of push bodies include a first plurality of push bodies allocated to the first region, and
wherein the first temperature regulator includes:
a first supply flow path that is formed inside the pusher, is allocated to first region, and receives a main temperature regulating fluid;
a first fluid diffusion chamber formed inside the pusher so as to communicate fluid with the first supply flow path, in which the main temperature regulating fluid conveyed from the first supply flow path is diffused; and
a plurality of first jet flow paths that are formed respectively in the first plurality of push bodies, communicate fluid with the first fluid diffusion chamber, and convey the main temperature regulating fluid diffused in the first fluid diffusion chamber to the first region.

3. The system of claim 2, wherein the plurality of push bodies further include a second plurality of push bodies allocated to the second region, and
wherein the second temperature regulator includes:
a second supply flow path that is formed inside the pusher, is allocated to the second region, and receives the main temperature regulating fluid;
a second fluid diffusion chamber formed inside the pusher so as to communicate fluid with the second supply flow path, in which the main temperature regulating fluid conveyed from the second supply flow path is diffused; and
a plurality of second jet flow paths that are formed respectively in the second plurality of push bodies, communicate fluid with the second fluid diffusion chamber, and convey the main temperature regulating fluid diffused in the second fluid diffusion chamber to the second region.

4. The system of claim 3, further comprising a fluid supply part connected to the first supply flow path and the second supply flow path in such a way as to communicate fluid, for supplying the main temperature regulating fluid to the first temperature regulator and the second temperature regulator at the same time, in order to regulate the temperatures of the first region and the second region are regulated at the same time.

5. The system of claim 2, wherein the first temperature regulator further includes a first auxiliary flow path that is formed inside the pusher and conveys an auxiliary temperature regulating fluid to the first fluid diffusion chamber.

6. The system of claim 5, wherein the first temperature regulator further includes a first temperature sensor for measuring the temperature of the first region, to continuously supply the main temperature regulating fluid to the first region, and to selectively supply the auxiliary temperature regulating fluid to the first auxiliary flow path based on a temperature measured by the first temperature sensor, so that the temperature of the first region is maintained within a predetermined temperature range.

7. The system of claim 5, wherein the first temperature regulator further includes a projecting member that is disposed inside the first fluid diffusion chamber to face an outlet of the first auxiliary flow path, protrudes into an inner space of the first fluid diffusion chamber, and disperses the auxiliary temperature regulating fluid conveyed from the first auxiliary flow path in the inner space of the first fluid diffusion chamber.

8. The system of claim 7, wherein the first temperature regulator further includes a backflow preventing member positioned between an outlet of the first supply flow path and the projecting member, for blocking off part of the inner space of the first fluid diffusion chamber, so as to prevent the auxiliary temperature regulating fluid dispersed by the projecting member from flowing back from the inside of the first fluid diffusion chamber toward the outlet of the first supply flow path.

9. The system of claim 8, wherein the backflow preventing member divides the first fluid diffusion chamber into a first upper fluid diffusion chamber in which the outlet of the first supply flow path and the outlet of the first auxiliary flow path are positioned and a first lower fluid diffusion chamber in which an outlet of the first fluid diffusion chamber and the projecting member are positioned.

10. The system of claim 9, wherein the backflow preventing member includes a fluid communicating hole through which fluid is communicated between the first upper fluid diffusion chamber and the first lower fluid diffusion chamber, so that the main temperature regulating fluid is conveyed to the first lower fluid diffusion chamber after being diffused in the first upper fluid diffusion chamber.

11. The system of claim 9, wherein the backflow preventing member includes a center hole formed between the first auxiliary flow path and the projecting member so that the auxiliary temperature regulating fluid conveyed to the first upper fluid diffusion chamber is conveyed toward the projecting member.

12. The system of claim 1, further comprising:
a first plurality of diffusion plates between a housing of the pusher and a first plurality of push bodies of the pusher that are allocated to the first region; and
a second plurality of diffusion plates between the housing of the pusher and a second plurality of push bodies of the pusher that are allocated to the second region,
wherein the first temperature regulator is on the first plurality of diffusion plates, and the second temperature regulator is on the second plurality of diffusion plates.

* * * * *